(12) United States Patent
Shih et al.

(10) Patent No.: US 8,324,037 B1
(45) Date of Patent: Dec. 4, 2012

(54) FABRICATION METHODS FOR HEMT DEVICES AND CIRCUITS ON COMPOUND SEMICONDUCTOR MATERIALS

(76) Inventors: Ishiang Shih, Brossard (CA); Cindy X. Qiu, Brossard (CA); Chunong Qiu, Brossard (CA); Yi-Chi Shih, Palos Verdes Estates, CA (US); Julia Qiu, Brossard (CA)

( * ) Notice: Subject to any disclaimer, the term of this patent is extended or adjusted under 35 U.S.C. 154(b) by 0 days.

(21) Appl. No.: 13/200,614

(22) Filed: Sep. 28, 2011

(51) Int. Cl.
*H01L 21/338* (2006.01)
(52) U.S. Cl. ............... 438/172; 257/194; 257/E29.246
(58) Field of Classification Search .......... 438/172
See application file for complete search history.

(56) References Cited

U.S. PATENT DOCUMENTS 5,869,364 A * 2/1999 Nakano et al. ............. 438/167

* cited by examiner

*Primary Examiner* — Tony Tran

(57) ABSTRACT

The prior art method for the formation of T-gate or inverted L-gate is achieved through several lift-off processes and requires at least two different photoresists and hence two different developers. In one embodiment of the present invention, an etching method for the formation of the source, the drain and the T-gate or inverted L-gate of a compound semiconductor HEMT device is disclosed. In such a method, only one type of photoresist and developer are needed. In one other embodiment, a fabrication process for a HEMT device is disclosed to have the stem of the T-gate or the inverted L-gate defined by a dielectric cavity and its mechanical strength enhanced by a dielectric layer. In another embodiment, a fabrication process for a HEMT device is disclosed to have the stems of the source and the drain defined by dielectric cavities and their mechanical strength enhanced by a dielectric layer. In yet another embodiment, a fabrication process for a HEMT device is revealed to have the stems of the source, the drain and the T-gate or inverted L-gate of a compound semiconductor HEMT strengthened by dielectric supporting pillars.

9 Claims, 9 Drawing Sheets

Prior Art

FABRICATION METHODS FOR HEMT DEVICES AND CIRCUITS ON COMPOUND SEMICONDUCTOR MATERIALS

FIELD OF THE INVENTION

This invention relates to fabrication methods for the formation of high frequency HEMT devices or circuits on compound semiconductor channel layer. More specifically, it relates to fabrication methods for the formation of source, drain and gate of compound semiconductor HEMT devices and circuits.

BACKGROUND OF THE INVENTION

In circuits for high frequency applications, mobility of charge carriers in the channels of the devices must be made as high as possible. The most successful method to increase the charge carrier mobility is by modulating doping to provide charge carriers in the channel of a high electron mobility transistor, HEMT. Using HEMTs based on multi-layer structures of compound semiconductors such as AlGaAs—InGaAs—GaAs, high quality millimeter devices and circuits have been developed.

Figure 1A:
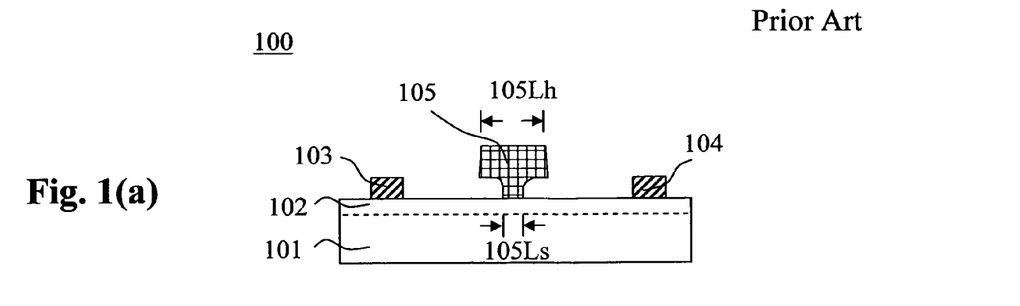
FIGS. 1(a)-1(g) show schematic cross-sectional diagrams of a HEMT structure and a prior art method for fabrication of a HEMT device. In such a method, three photomasks are required: a first mask for the formation of the source and the drain, a second and a third mask for the formation of the T-gate structure.
Figure 1B:
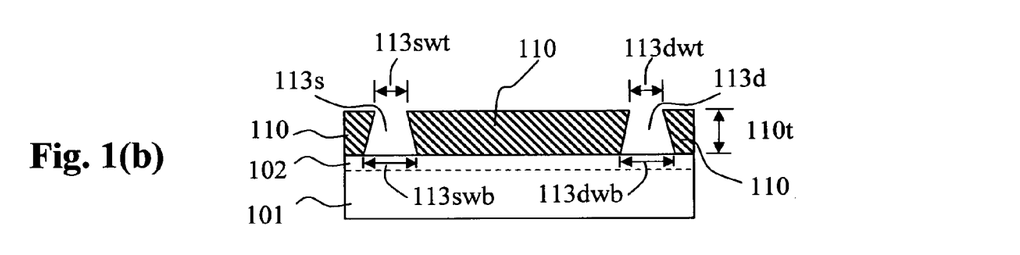
Figure 1C:
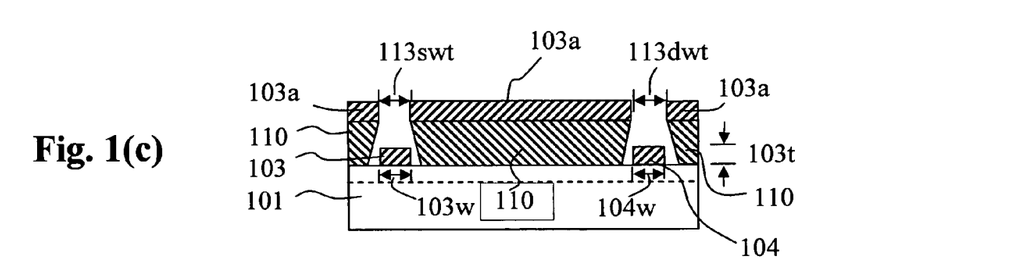
Figure 1D:
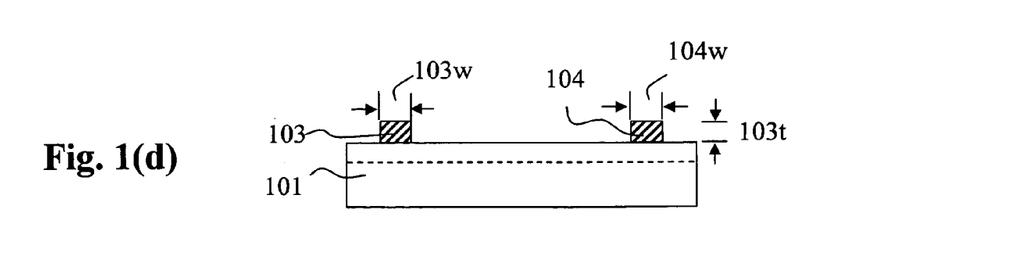

A HEMT (100) structure as shown in FIG. 1(a) is constructed on a substrate (101) having a channel layer (102). In order to achieve modulation of conductance of the channel layer (102), a gate (105) of a head length (105Lh) and a stem length (105Ls) is fabricated between a source (103) and a drain (104). To reduce the unwanted parasitic series resistance, the contacts between the source (103) and channel layer (102) and that between the drain (104) and the channel layer (102) are made to have near ohmic behavior. Whereas, the contact between the gate (105) and the channel layer (102) is non-conducting or rectifying in order to achieve modulation of charge density in the channel layer (102). Therefore, the construction of a HEMT will require having at least two metal deposition/patterning processes to serve the two needs. Due to the sensitivity of the InGaAs-based channel layer to photoresist developer and etchants of metals for source, drain and gate, the fabrication of HEMTs is achieved only by a liftoff process. As shown in FIG. 1(b), a first photoresist (110) with a thickness (110t) is applied, baked, exposed through a first mask and developed to form two cavities (113s, 113d). The cavity for the formation of the source (113s) has a top width (113swt) and a bottom width (113swb) and the cavity for the drain (113d) has a top width (113dwt) and a bottom width (113dwb). A first metal layer of a thickness (103t, FIG. 1(c)) is then deposited to form the source (103) and the drain (104) with also a metal layers (103a) in the surrounding areas on the photoresist (110). After the source and drain metal deposition, metal layers (103a) in the surrounding areas are lift-off by immersing the substrate in a solvent which dissolves the photoresist. The isolated source (103) with a width (103w) and the drain (104) with a width (104w) are obtained (see FIG. 1(d)). In order to obtain successful liftoff, the two cavities (113s, 113d) must have reentrant cross-section so that the bottom width (113swb and 113dwb) is substantially larger than the top width (113swt and 113dwt) in FIGS. 1(b) and 1(c). Furthermore, thickness of photoresist (110t) should be substantially larger compared to source and drain thickness (103t).

Figure 1E:
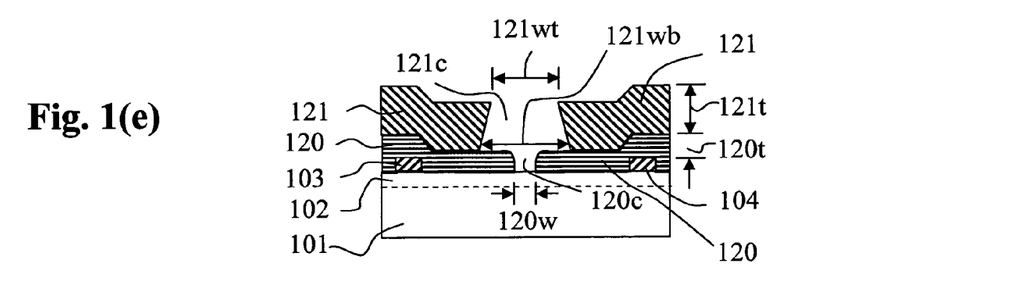
Figure 1F:
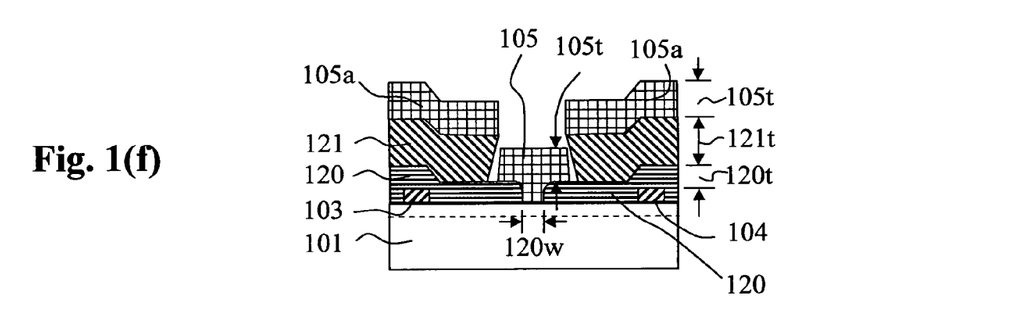
Figure 1G:
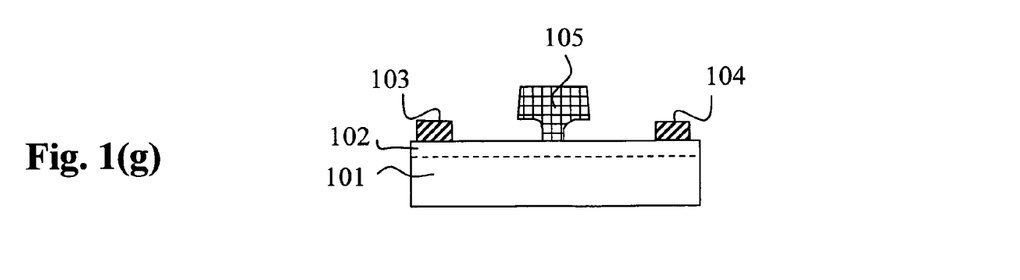

After the formation of source (103) and drain (104), a second photoresist layer (120) of thickness (120t) is applied, baked, exposed through a second photomask and developed to form a stem cavity (120c) of a width (120w). A third photoresist layer (121) of thickness (121t) is then applied, baked, exposed through a third photomask and developed to form a head cavity (121c) with a top width (121wt) and a bottom width (121wb). As shown in FIG. 1(e), the bottom width (121wb) of the head cavity (120c) must be made substantially larger than the top width (121wt) to facilitate subsequent lift-off. After the formation of the stem cavity (120c) and the head cavity (121c), a gate metal (105) with a gate metal thickness (105t) (see FIG. 1(f)) is deposited with surrounding metal layers (105a) on the third photoresist (121). After the gate metal deposition, metal layers in the surrounding areas (105a) are removed by immersing the substrate in a solvent which dissolves the photoresist and the gate (105) is obtained (see FIG. 1(g)). In order to obtain successful lift-off, the head cavity (121c) must have reentrant cross-section so that the bottom width (121wb) is substantially larger than the top width (121wt, see FIGS. 1(e) and 1(f). Furthermore, thickness of third photoresist (121t) should be substantially larger compared to gate metal thickness (105t).

OBJECTIVES OF THE INVENTIONS

One objective is to provide a HEMT T-gate or inverted L-gate structure and process wherein stem of the gate structure is defined and enhanced by dielectric pillars.

Another objective of this invention is to provide a HEMT device and circuit process without the need of lift-off steps.

One other objective of this invention is to use only one type of photoresist and developer for the formation of the source, the drain and the gate of a HEMT device.

Still another objective of the invention is to provide fabrication process for a HEMT device where the stems of the source and the drain is defined by dielectric cavities and enhanced by dielectric pillars.

DETAILED DESCRIPTION OF THE PREFERRED EMBODIMENTS

I. HEMTs with Supportive Pillars

The prior art processing steps for HEMT devices and circuits on compound semiconductor channels involve lift-off processes for the formation of the source, the drain and the gate structure. In order to achieve high operation frequency, the dimensions of the head portion of the gate should be large compared to dimensions of the stem portion. The process control for formation of such gate structure using the lift-off processes is more difficult and requires at least two different photoresists and hence two different developers. Furthermore, the stem portion of the T-gate or inverted L-gate manufactured by conventional lift-off processes on the compound semiconductors is often weak due to a lack of mechanical support. Therefore, reliability and integrity of the HEMT devices and circuits may be degraded during operation especially under high power conditions.

Figure 2:
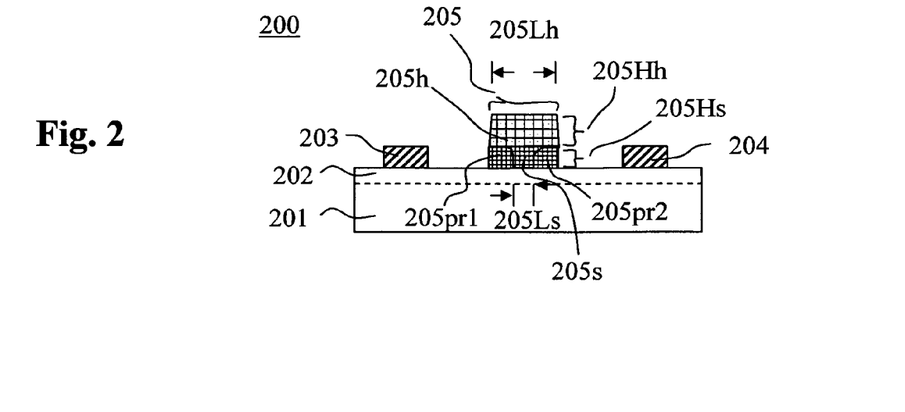
FIG. 2 shows a HEMT T-gate or inverted L-gate structure wherein stem of the gate structure is defined and enhanced by dielectric pillars.

According to one embodiment of this invention, a HEMT device (200, FIG. 2) for microwave and millimeter wave circuits is formed on a compound semiconductor substrate (201) having a conducting channel layer (202). A source (203) and a drain (204) make substantially ohmic contacts to the conducting channel layer (202). A gate (205) has a head portion (205h) and a stem portion (205s), where the head portion (205h) has a head height (205Hh) and a head length (205Lh) and the stem portion (205s) has a stem height (205Hs) and a stem length (205Ls). A first space defined by the left side of the stem portion (205s) and the head portion (205h) is filled by a first insulating pillar (205pr1), whereas a second space defined by the right side of the stem portion (205s) and the head portion (205h) is filled by a second insulating pillar (205pr2), to enhance mechanical strength of the stem portion (205s) on the conducting channel layer (202).

II. HEMTs on Compound Semiconductors with Etched Source, Drain and Gate

Figure 3A:
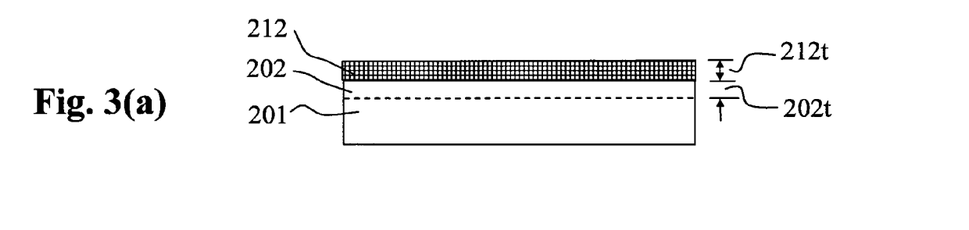
FIGS. 3(a)-3(m) illustrates cross sectional diagrams showing the main processing steps in this invention for the fabrication of source, drain and gate of a HEMT by using three photomasks.

According to another embodiment of this invention, etching processes instead of lift-off processes is used to form source, drain and gate of a HEMT device. As shown in FIG. 3(a), a substrate (201) with a conducting channel layer (202) of thickness (202t) and a first passivation layer (212) is used for the HEMT device fabrication. The first passivation layer (212) has a first passivation layer thickness (212t) and it may be selected from a material group comprising: SiN, SiON, and HfO. The conducting channel layer (202) may preferably have a sandwiched structure of GaN—AlGaN—GaN with piezoelectric-induced channel charges and optional modulating doping whereas said substrate (201) may be Si, sapphire, SiC or monocrystalline GaN. The conducting channel layer (202) may also be GaAs—AlGaAs—InGaAs—GaAs sandwich structure with modulation doping and the substrate (201) may be GaAs or Si.

Figure 3B:
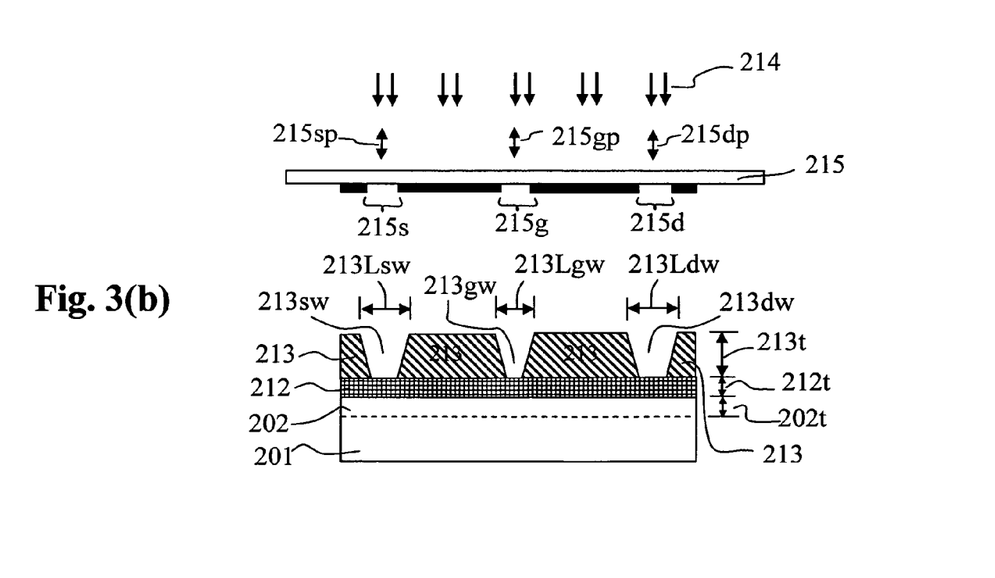
Figure 3C:
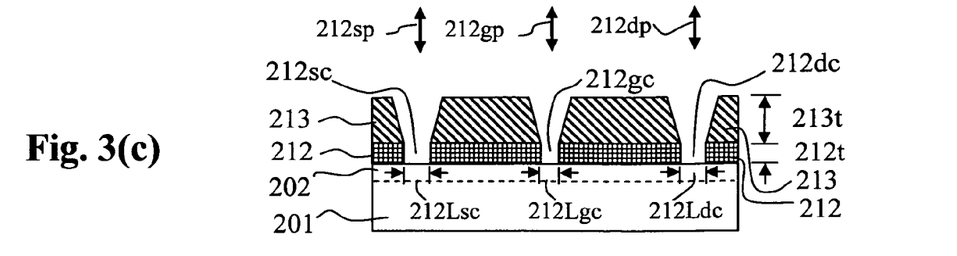

The main etching processes steps for the fabrication of a source, a drain and a T-gate for the HEMT devices are illustrated in FIGS. 3(b)-3(m). As shown in FIG. 3(b), a first photoresist layer (213) is applied on the first passivation layer (212) to a first photoresist layer thickness (213t) after baking. The first photoresist layer (213) is exposed to a UV light (214) through a first photomask (215) containing a first mask source window (215s) with a first mask source window center (215sp), first mask drain window (215d) with a first mask drain window center (215dp) and a first mask gate window (215g) with a first mask gate window center (215gp). After developing, a source window (213sw) of length (213Lsw), a gate window (213gw) of length (213Lgw) and a drain window (213dw) of length (213Ldw) are created. As shown in FIG. 3(c), an etching step is then performed to remove exposed portions of the first passivation layer (212) to form a source cavity (212sc) with a source cavity center and a source cavity length of (212Lsc), a drain cavity (212dc) with a drain cavity center and a drain cavity length (212Ldc) and a gate cavity (212gc) with a gate cavity center and a gate cavity length (212Lgc). It is clear from FIGS. 3(b) and 3(c) that the center of first mask source window (215sp) defines the source cavity center (212sp), the center of first mask drain window (215dp) defines the drain cavity center (212dp) whereas the center of the first mask gate window (215gp) defines the gate cavity center (212gp). It is also apparent that the gate cavity center (212gp) will define a gate stem center when a gate is formed in a later stage.

Figure 3D:
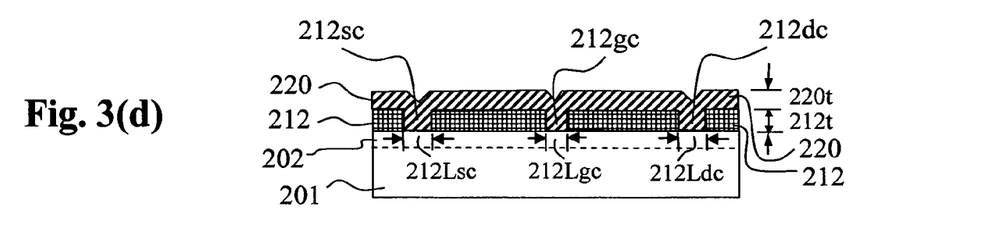

After the removal of the first photoresist layer (213), a first metal layer (220), as shown in FIG. 3(d) is deposited by thermal evaporation or sputtering over the entire substrate surface to a thickness of (220t). Materials for the first metal layer are selected so that contact resistance between the first metal layer (220) and the conducting channel layer (202) can be made to be low to ensure a low ohmic contact between the source and the conducting channel layer and between the drain and the conducting channel. The first metal layer can be selected from a group of low work function metals and metal alloys. When a two-layered metal system is adopted for the source and the drain, at least the bottom layer of the first metal layer in contact with the conducting channel layer will be a low work function metal or a low work function metal alloy. Some material examples for the first metal layer are: Ti—Au and TiMg—Au, with the low work function metal or alloy deposited directly on the channel layer.

Figure 3E:
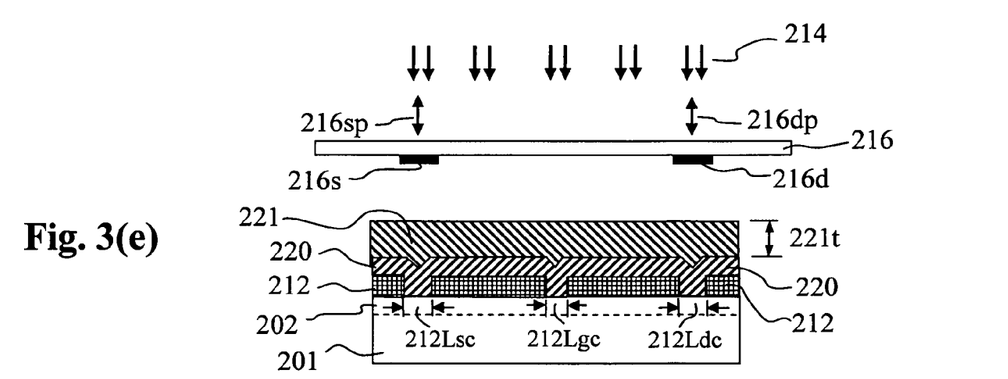
Figure 3F:
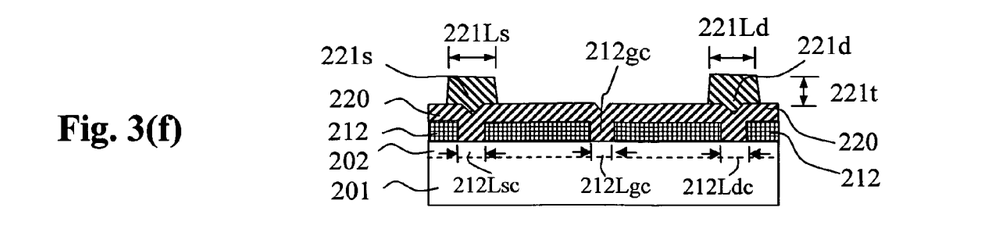
Figure 3G:
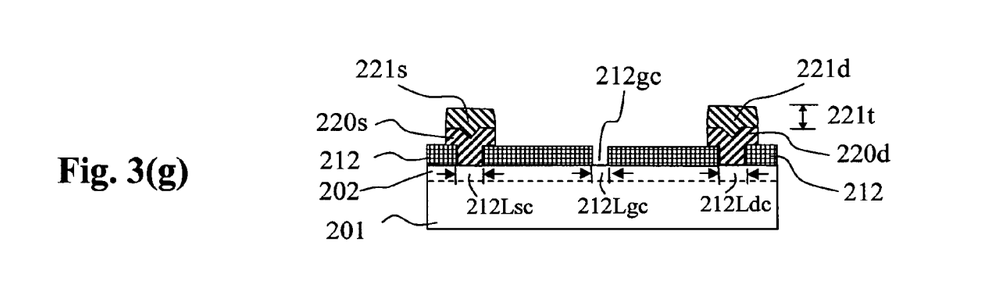
Figure 3H:
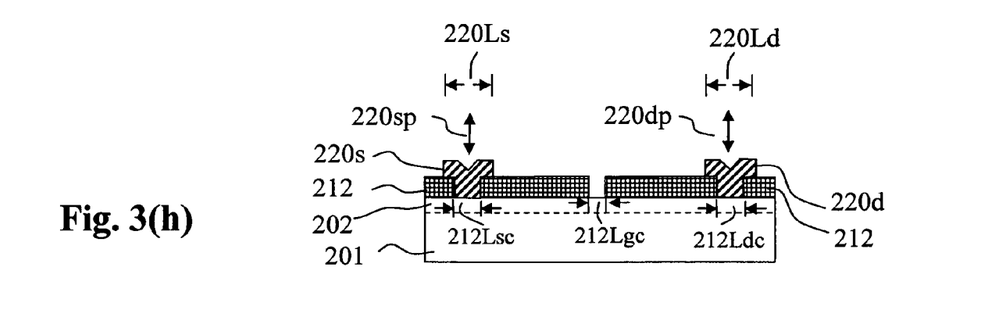

After this, a second photoresist layer (221) of thickness (221t) is applied, baked, and exposed to UV light (214) through a second photomask (216) (see FIG. 3(e)). This second photomask (216) has a second mask source pattern (216s) with a second mask source pattern center (216sp) and a second mask drain pattern (216d) with a second mask drain pattern center (216dp). It should be noted that the second mask source pattern center (216sp in FIG. 3(e)) is aligned to the source cavity center (212sp in FIG. 3(c)) whereas the second mask drain pattern center (216dp in FIG. 3(e)) is aligned to the drain cavity center (212dp in FIG. 3(c)). As shown in FIG. 3(f), the second photoresist layer (221) is then developed to form a first source photoresist pattern (221s) having a first source photoresist pattern length (221Ls) and a first drain photoresist pattern (221d) having a first drain photoresist pattern length (221Ld). The exposed first metal layer (220) is then etched by a drying etching or a wet etching step as shown in FIG. 3(g) to form a first source portion (220s) and a first drain portion (220d). If a wet etching process is opted for the etching of the first metal layer (220), a first etching solution is selected so that it can etch away the exposed first metal layer (220) but does not attack both the exposed first passivation layer (212) and the exposed conducting channel layer (202) in the gate cavity region (212gc). The first source photoresist pattern (221s) and the first drain photoresist pattern (221d) are then removed and the substrate is subjected to a thorough cleaning process, completing the creation of the first source portion (220s) having a first source portion center (220sp) and the first drain portion (220d) having a first drain portion center (220dp), as shown in FIG. 3(h), with the first source portion center (220sp) aligned to the source cavity center (212sp, FIG. 3(c)) and the first drain portion center (220dp) aligned to the drain cavity center (212dp, FIG. 3(c)). The first source portion (220s) has a top length (220Ls) and a bottom length defined by the source cavity length (212Lsc) and the first drain portion (220d) has a top length (220Ld) and a bottom length defined by the drain cavity length (212Ldc).

In order to reduce further the resistance between the first source portion (220s) and conducting channel layer (202) and between the first drain portion (220d) and the conducting channel layer (202), an annealing step is then performed at an elevated temperature for a controlled duration. For GaN—AlGaN—GaN channel structure, the following conditions may be used: 700-900° C. for 30 seconds. In order to remove the top layer of the conducting channel layer from the gate cavity (212gc), which often contains doping impurities, an etching step may be performed to create a recess in the gate cavity (212gc). This etching step can be carried out either before or after the annealing step.

Figure 3I:
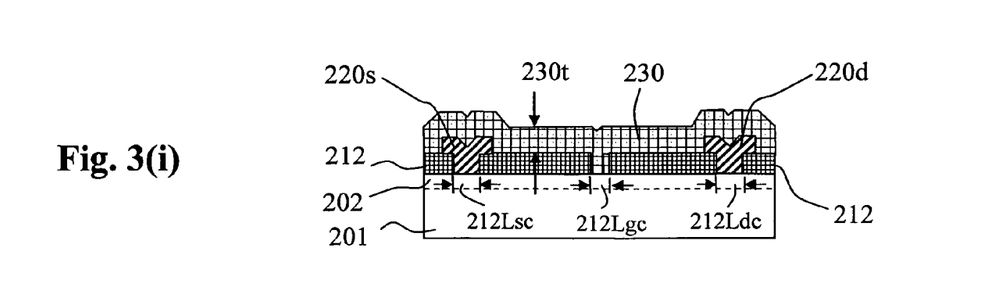

A second metal layer (230) is then deposited over the entire substrate surface to a second metal layer thickness (230t) (FIG. 3(i)). Materials for the second metal layer (230) are selected so that the contact between the gate and the channel layer (202) is non-conducting or rectifying in order to achieve modulation of charge density in the channel layer (202) and it can be selected from a group of high work function metals and metal alloys. When a two-layered or three-layered metal structure is adopted for the gate, at least the bottom layer of the second metal layer (230) in contact with the conducting channel layer (202) will be a high work function metal or a high work function metal alloy. Some material examples for the gate are Ni—Al-Au, Ni—Au, NiCr—Au, and NiCr—Al-Au, with the high work function metal or alloy deposited directly on the conducting channel layer.

Figure 3J:
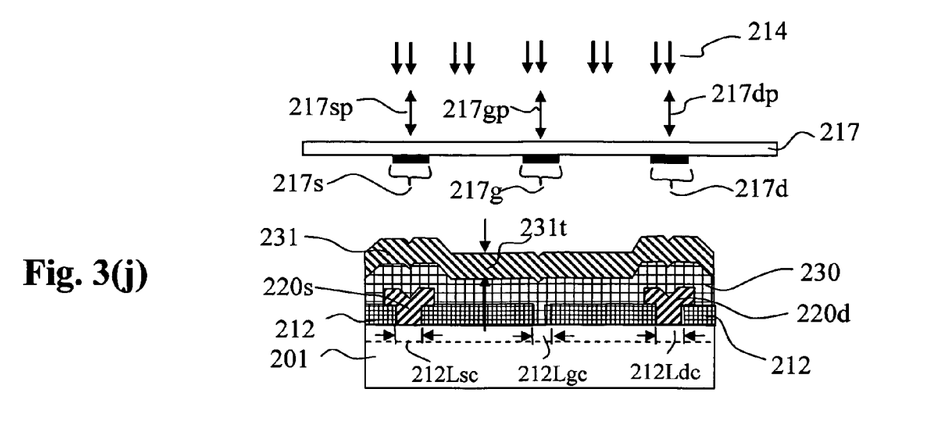

A third photoresist layer (231, FIG. 3(j)) of thickness (231t) is then applied, baked, and exposed to UV light (214) through a third photomask (217). As shown in FIG. 3(j), the third photomask (217) has a third mask source pattern (217s) with a third mask source pattern center (217sp), a third mask drain pattern (217d) with a third mask drain pattern center (217dp), and a third mask gate pattern (217g) with a third mask gate pattern center (217gp). It should be pointed out that during the exposure the third mask source pattern center (217sp) is aligned to the first source pattern center (220sp, FIG. 3(h)) and therefore to the second mask source pattern center (216sp in FIG. 3(e)). Similarly, the third mask drain pattern center (217dp) is aligned to the first drain portion center (220dp in FIG. 3(h)) and hence to the second mask drain pattern center (216dp in FIG. 3(e)). The third mask gate pattern center (217gp) is aligned to the gate cavity center (212gp, FIG. 3(c)) and hence in turn is also aligned to a gate stem center which allow one to obtain a symmetrical T-gate after a subsequent etching processes.

Figure 3K:
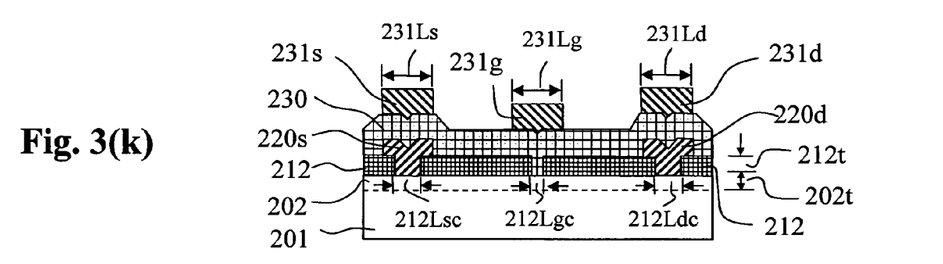
Figure 3L:
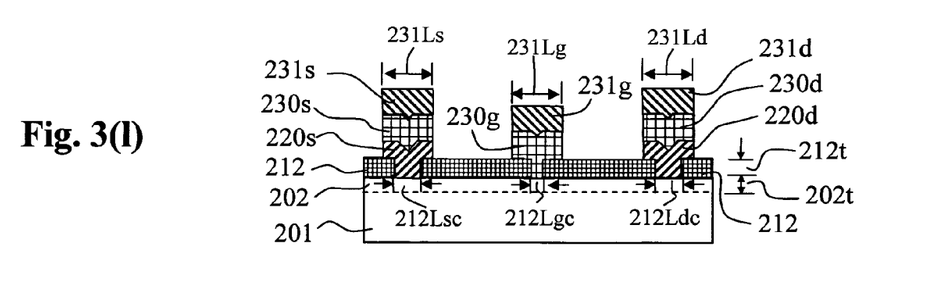
Figure 3M:
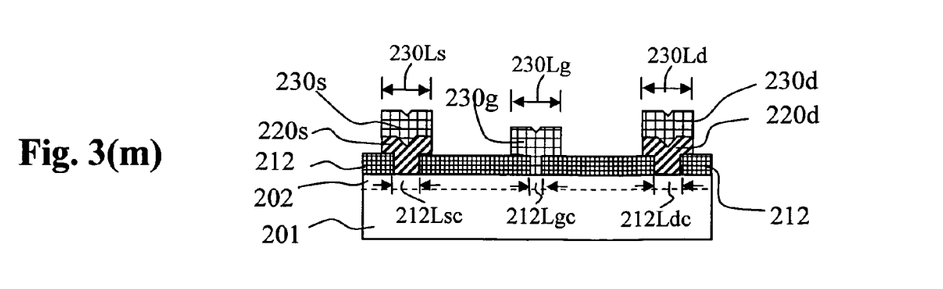

As shown in FIG. 3(k), the third photoresist layer (231) is then developed to form a second source photoresist pattern (231s) having a second source photoresist pattern length (231Ls), a second drain photoresist pattern (231d) having a second drain photoresist pattern length (231Ld), and a gate photoresist pattern (231g) having a gate photoresist pattern length (231Lg). The exposed second metal layer (230) is then etched by a drying etching or a wet etching step to form a second source portion (230s), a second drain portion (230d) and a gate portion (230g), as illustrated in FIG. 3(l). When a wet etching process is selected to etch the second metal layer (230), a second etching solution should be selected so that it can etch away the exposed second metal layer (230) but does not attack the exposed first passivation layer (212). The second source photoresist pattern (231s) and the second drain photoresist pattern (231d) are then removed and the substrate is subjected to a thorough cleaning process, which completes the creation of the HEMT as shown in FIG. 3(m), without the need of lift-off steps.

In this HTMT, the source consists of two metal layers (220s and 230s) and it has a larger top length (230Ls) and a smaller bottom length (212Lsc), the drain too comprises two metal layers (220d and 230d) with a larger top length (230Ld) and a smaller bottom length (212Ldc), and the gate (230g) also has a larger top length (230Lg) and a smaller bottom length (212Lgc). Therefore, the source (220s and 230s), the drain (220d and 230d) and the gate (230g) all have a head portion and a smaller stem portion. Furthermore, stem portions of the source, the drain and the gate are supported by the passivation layer (212) underneath the head portions and therefore the structure has an enhanced mechanical strength. It should be pointed out that although a smaller bottom length has been illustrated above for the source and the drain, they can also be made to have the same bottom length and top length.

III. Removing the Top Layer of the Conducting Channel Layer by Etching

Figure 4A:
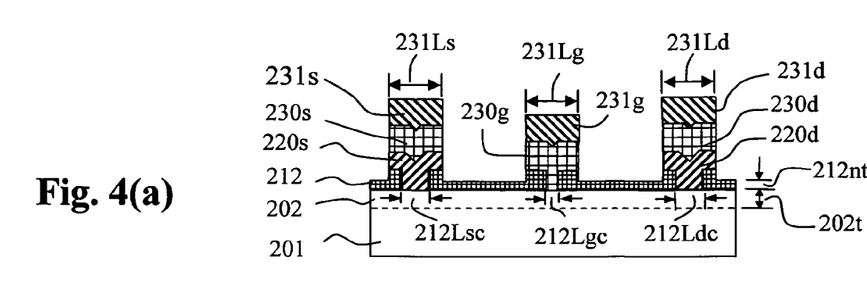
FIGS. 4(a) and 4(b) illustrate cross-sectional views of the HEMT in FIG. 3(l), where a partial or a complete etching of the passivation layer in the surrounding regions is performed to enhance HEMT performance.

The top layer of the conducting channel layer often contains doping impurities, which are introduced to reduce the contact resistance of the source and the drain but not for providing charge carriers to the conducting channel. In order to reduce the unwanted leakage between the source and the drain, these doping impurities in the top layer should be removed. This is achieved according to yet another embodiment of the invention and is as illustrated in FIGS. 4(a)-4(d). In FIG. 4(a) the cross sectional diagram of the HEMT at the fabrication stage illustrated in FIG. 3(l) is shown, where the exposed first passivation layer (212) of the HEMT is etched selectively from the original thickness of (212t) down to a new thickness (212nt). The partially etched passivation layer (212) creates support pillars under the head portions of the source (220s), the drain (220d) and the gate (230g), hence enhancing the mechanical strength of the structures.

Figure 4B:
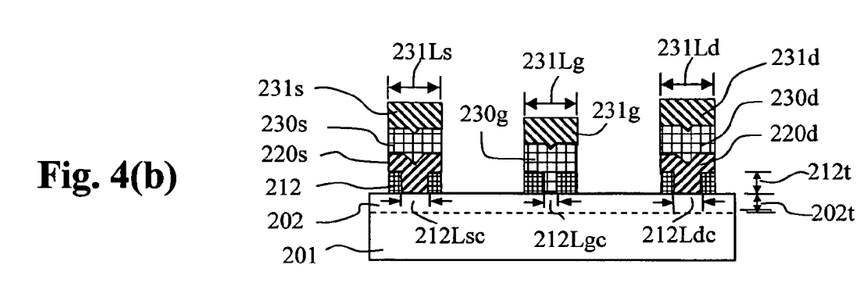
Figure 4C:
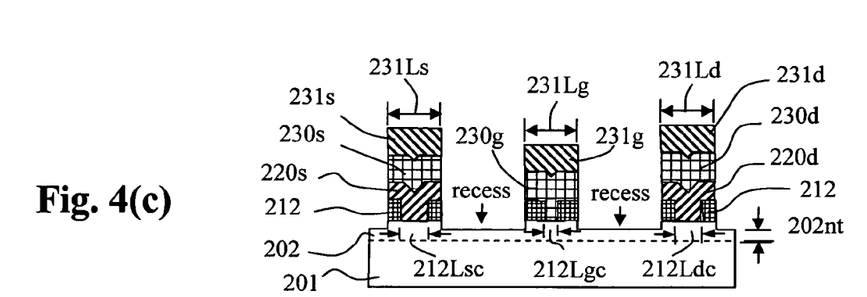
FIGS. 4(c) and 4(d) show complete etching of the passivation layer and a partial etching of the channel layer to create recess regions for performance enhancement.

This etching is continued until the top layer of the conducting channel layer (202) is exposed (see FIG. 4(b)). When this is achieved, the substrate is immersed in a third etching solution which preferentially etches the top layer of the conducting channel layer (202) which contains the doping impurities (FIG. 4(c)). This etching step results in a new thickness (202nt) in the exposed regions of the conducting channel layer (202) and creates recesses. The second source photoresist pattern (231s), the second drain photoresist pattern (231d) and the gate photoresist pattern (231g) are then removed. After that, the substrate is thoroughly cleaned and dried, which completes the fabrication of the HEMT device structure with recessed conducting channel layer (see FIG. 4(d)). In this HTMT, the source (220s, 230s), the drain (220d, 230d) and the gate (230g) are made to have a head portion and a stem portion. However, the source and the drain can also be made to have the same bottom length and top length.

Figure 4D:
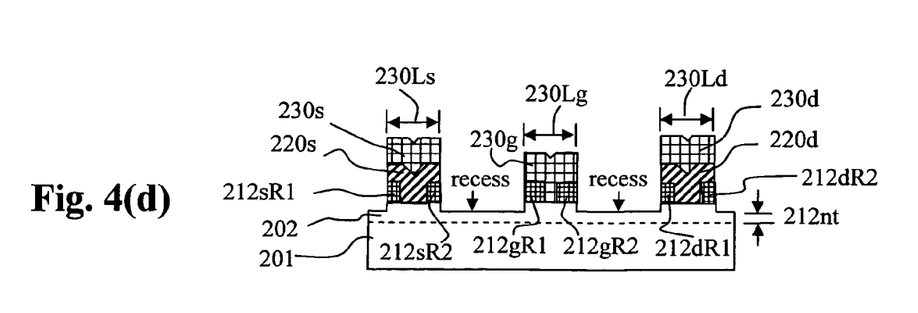

According to one other embodiment, above described fabrication process also creates a first gate pillar (212gR1, FIG. 4(d)) under the left hand space of the head portion of the gate (230g) whereas a second gate pillar (212gR2) is created under the right hand space of the head portion of the gate (230g). The first gate pillar (212gR1) and second gate pillar (212gR2) are electrically insulating and they enhance the mechanical strength of the gate structure (230g).

According to yet another embodiment, a first source pillar (212sR1, FIG. 4(d)) is created under the left hand space of the head portion of the source (220s, 230s) whereas a second source pillar (212sR2) is created under the right hand space of the head portion of the source (220s, 230s). Both the first source pillar (212sR1) and second source pillar (212sR2) are insulating and they enhance the mechanical strength of the source structure.

According to still another embodiment, a first drain pillar (212dR1, FIG. 4(d)) is created under the left hand space of the head portion of the drain (220d and 230d) whereas a second drain pillar (212dR2) is created under the right hand space of the head portion of the drain (220d, 230d). Both the first drain pillar (212dR1) and second drain pillar (212dR2) are insulating and they enhance the mechanical strength of the drain structure.

Figure 4E:
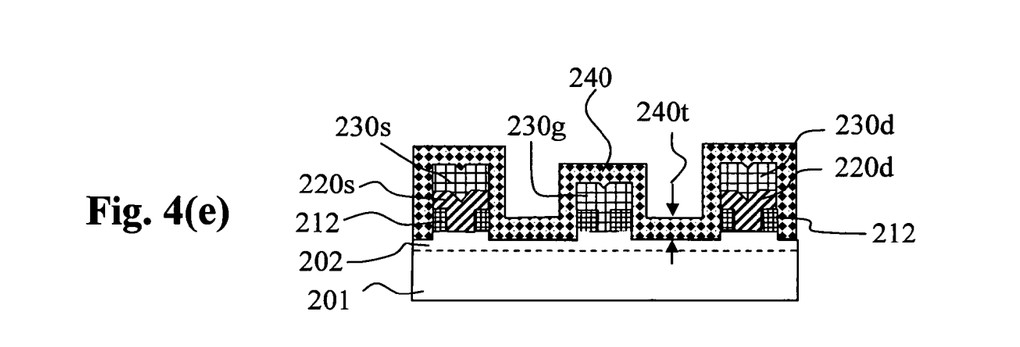
FIGS. 4(e) and 4(f) demonstrate the deposition of a second passivation layer and the creation of the contact windows for the source, the drain and the gate.
Figure 4F:
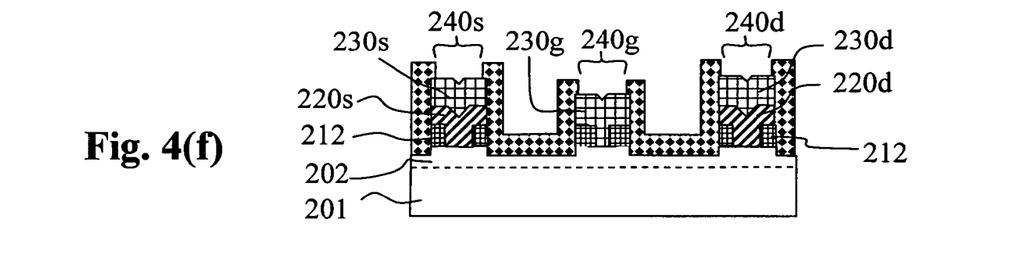

As shown in FIG. 4(e), a second passivation layer (240) may now be deposited over the entire substrate surface to a second passivation layer thickness (240t). After this, a fourth photoresist layer (not shown) is applied, baked, and exposed to a UV light through a fourth mask to create a fourth photoresist source window, a fourth photoresist drain window and fourth photoresist gate window. After developing, the exposed second passivation layer (240) is etched to produce a source contact window (240s), a drain contact window (240d) and a gate contact window (240g), as illustrated in FIG. 4(f). The material of the second passivation layer (240) is selected from a group comprising: SiN, SiON, and HfO.

IV. Inverted L-Gate Structure

For certain applications, it is preferable to have a gate with a non-symmetrical head portion or with the center of the head portion shifted substantially away from the center of the stem portion. This can be achieved by the etching methods on compound semiconductor substrates as illustrated below.

Figure 5A:
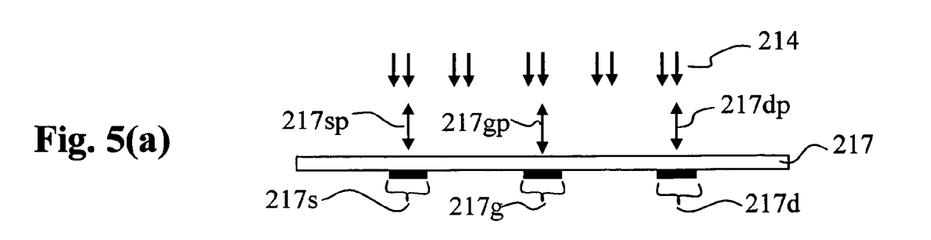
FIG. 5(a) shows a photomask for the formation of a source, a drain and T-gate structure for a HEMT device, while 5(b) is a mask for the formation of a source, a drain and an inverted L-gate structure for a HEMT device.
Figure 5B:
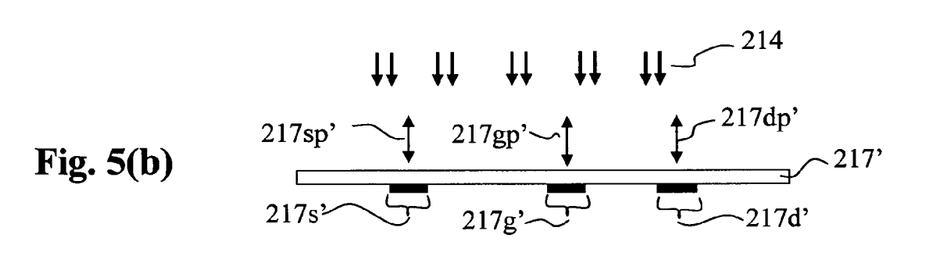

FIG. 5(a) shows patterns of the third mask (217) for the definition of the second source portion (230s), the second drain portion (230d) and the gate portion (230g) for a HEMT shown in FIG. 3(j) where the fabricated gate (230g) has the center of the head portion aligned to the center of the stem portion forming a T-gate structure. The third photomask (217) has a third mask source pattern (217s) having a third mask source pattern center (217sp), a third mask drain pattern (217d) having a third mask drain pattern center (217dp), and a third mask gate pattern (217g) having a third mask gate pattern center (217gp). To fabricate a HEMT with non symmetrical or non-aligned head portion with respect to the stem, a new third mask (217') as shown in FIG. 5(b) can be used. Here in the new third mask (217'), has a new third mask source pattern (217s') having a new third mask source pattern center (217sp'), a new third mask drain pattern (217d') having a new third mask drain pattern center (217dp'), and a new third mask gate pattern (217g') having a new third mask gate pattern center (217gp').

The new third mask source pattern (217s') is aligned to the third mask source pattern (217s), the new third mask drain pattern (217d') is aligned to the third mask drain pattern (217d). However, the new third mask gate pattern (217g') has been shifted to the right with respect to the third mask gate pattern (217g).

Figure 5C:
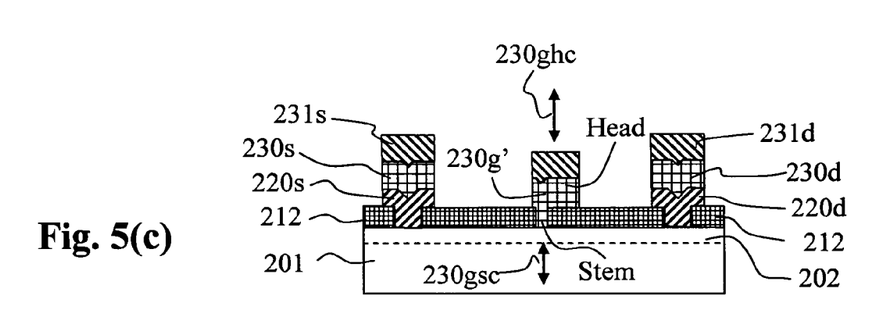
FIGS. 5(c) and (d) illustrate the cross sectional diagrams of a HEMT with an inverted L-gate structure at the final fabrication steps.
Figure 5D:
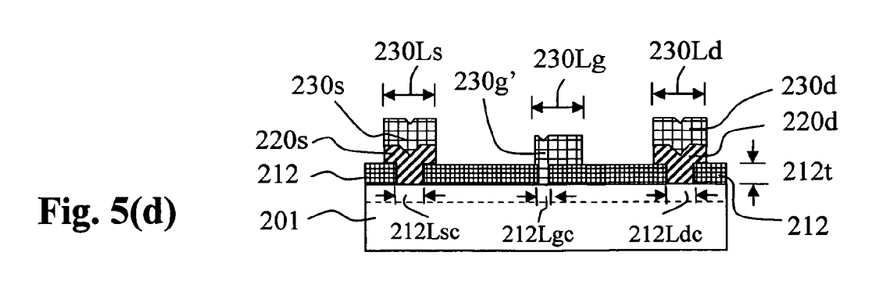

When the new third mask (217') is used to pattern the second metal layer (230) to form the source (230s), the drain (230d) and the gate (230g'), as shown in FIG. 5(c), the center of the head portion of the gate (230ghc) will not be aligned to the center of the stem portion (230gsc) of the gate (230g'). Therefore, a HEMT with an inverted L-gate can be fabricated relatively easily using the present etching methods in order to fulfill frequency requirements. FIG. 5(d) illustrates the complete HEMT with the inverted L-gate after the photoresist layer (231) is removed. In this HEMT, the source (220s and 230s) has a top length (230Ls) and smaller bottom length (212Lsc) forming a head portion and stem portion. The drain (220d and 230d) also has a larger top length (230Ld) and a smaller bottom length (212Ldc) forming a head portion and a stem portion. The head of the gate (230g') as well as the head of the source and the drain are supported by the passivation layer (212).

What is claimed is:

1. A fabrication method for a source, a drain and a gate of a compound semiconductor HEMT device comprising:
   providing a substrate with a conducting channel layer,
   providing a first passivation layer having a first passivation layer thickness,
   applying a first photoresist layer having a first photoresist layer thickness,
   exposing said first photoresist layer through a first photomask and developing said first photoresist layer, forming a first photoresist source window, a first photoresist drain window and first photoresist gate window,
   etching exposed portion of said first passivation layer for forming a source cavity with a source cavity length, a drain cavity with a drain cavity length, and a gate cavity with a gate cavity length in said first passivation layer, said gate cavity is for stem portion of said gate and has a gate cavity center,
   removing said first photoresist layer,
   deposit a first metal layer having a first metal layer thickness,
   applying a second photoresist layer having a second photoresist layer thickness,
   exposing said second photoresist layer through a second photomask and developing said second photoresist layer, forming a first source pattern and a first drain pattern, said first source pattern has a first source pattern length and said first drain pattern has a first drain pattern length,
   etching exposed first metal layer to form a first source portion and a first drain portion, wherein said source cavity length defines a first source portion bottom length and said first source pattern length defines a first source portion top length; said drain cavity length defines a first drain portion bottom length and said first drain pattern length defines a first drain portion top length,
   removing said second photoresist layer,
   annealing at an elevated temperature for a duration,
   depositing a second metal layer having a second metal layer thickness,
   applying a third photoresist having a third photoresist layer thickness,
   exposing said third photoresist layer through a third photomask and developing said third photoresist layer, forming a second source pattern with a second source pattern length, a second drain pattern with a second drain pattern length and a gate pattern with a gate pattern length,
   etching exposed second metal layer, forming a second source portion having a second source portion length and a second drain portion having a second drain portion length, and forming said gate with a head portion and a stem portion, said gate head portion has a gate head length and a gate head center and said gate stem portion has a gate stem length and a gate stem center defined by said gate cavity center, wherein said second source portion length is defined by said second source pattern length, said second drain portion length is defined by said second drain pattern length and said gate head length is defined by said gate pattern length and said gate stem length is defined by said gate cavity length, removing said third photoresist layer and completing the fabrication of said HEMT device, wherein said head portion of said gate is supported by said first passivation layer to enhance mechanical strength of said stem portion of said gate, and wherein said second source portion length is larger than said first source portion bottom length and is substantially equal to said first source portion top length, forming a head portion and a stem portion, said head portion of said source is supported by said first passivation layer to enhance mechanical strength of said stem portion of said source.

2. A fabrication method for a source, a drain and a gate of a compound semiconductor HEMT device as defined in claim 1, wherein said gate stem center is aligned with said gate head center, forming a T-gate structure.

3. A fabrication method for a source, a drain and a gate of a compound semiconductor HEMT device as defined in claim 1, wherein said gate stem center is not aligned with said gate head center, forming an inverted L-gate structure.

4. A fabrication method for a source, a drain and a gate of a compound semiconductor HEMT device as defined in claim 1, wherein said substrate is selected from a material group comprising: Si, sapphire, SiC and monocrystalling GaN and said conducting channel layer may preferably have a sandwiched structure of GaN—AlGaN—GaN with piezoelectric-induced channel charges and optional modulation doping.

5. A fabrication method for a source, a drain and a gate of a compound semiconductor HEMT device as defined in claim 1, wherein said substrate is selected from a material group comprising GaAs and Si and said conducting channel layer may preferably have a sandwiched structure of GaAs—AlGaAs—InGaAs—GaAs with optional modulation doping.

6. A fabrication method for a source, a drain and a gate of a compound semiconductor HEMT device as defined in claim 1, wherein material of said first passivation layer is selected from a group comprising: SIN, SiON and HfO.

7. A fabrication method for a source, a drain and a gate of a compound semiconductor HEMT device as defined in claim 1, wherein at least a bottom layer of said first metal is selected from a group of low work function metals and metal alloys and at least a bottom layer of said second metal is selected from a group of high work function metals and metal alloys.

8. A fabrication method for a source, a drain and a gate of a compound semiconductor HEMT device as defined in claim 1, wherein said second drain portion length is larger than said first drain portion bottom length and is substantially equal to said first drain portion top length, forming a head portion and a stem portion, said head portion of said drain is supported by said first passivation layer to enhance mechanical strength of said stem portion of said drain.

9. A fabrication method for a source, a drain and a gate of a compound semiconductor HEMT device as defined in claim 1, further comprising a sub-step to etch a top layer of said conducting channel layer in said gate cavity before deposition of said second metal layer.

* * * * *